United States Patent

Chang et al.

[11] Patent Number: 5,981,339
[45] Date of Patent: Nov. 9, 1999

[54] NARROWER ERASE DISTRIBUTION FOR FLASH MEMORY BY SMALLER POLY GRAIN SIZE

[75] Inventors: Kent Kuohua Chang, Cupertino; David Chi, Sunnyvale; Yuesong He, San Jose, all of Calif.

[73] Assignee: Advanced Micro Devices, Inc., Sunnyvale, Calif.

[21] Appl. No.: 09/045,013

[22] Filed: Mar. 20, 1998

[51] Int. Cl.⁶ .............................................. H01L 21/8247
[52] U.S. Cl. ........................ 438/257; 438/594; 438/264
[58] Field of Search ................... 438/257, 264, 438/593, 594

[56] References Cited

U.S. PATENT DOCUMENTS

| | | | |
|---|---|---|---|
| 4,698,787 | 10/1987 | Mukherjee et al. | 365/185 |
| 5,231,299 | 7/1993 | Ning et al. | 438/257 |
| 5,420,060 | 5/1995 | Gill et al. | 438/264 |
| 5,512,505 | 4/1996 | Yuan et al. | 438/264 |
| 5,518,950 | 5/1996 | Ibok et al. | 437/67 |
| 5,561,620 | 10/1996 | Chen et al. | 365/218 |
| 5,598,369 | 1/1997 | Chen et al. | 365/185.27 |
| 5,650,649 | 7/1997 | Tsukiji | 257/316 |
| 5,654,217 | 8/1997 | Yuan et al. . | |
| 5,661,055 | 8/1997 | Hsu et al. | 438/259 |
| 5,680,345 | 10/1997 | Hsu et al. | 365/185.01 |

OTHER PUBLICATIONS

Wolf et al., "Silicon Processing for the VLSI Era vol. 1: Process Technology", pp. 177–182, Lattice Press, 1986.
Wolf et al., "Silicon Process for the VLSI Era vol. 1: Process Technology", Lattice Press, p. 28, 1986.
Haddad et al., "Degradations Due to Hole Trapping in Flash Memory Cells", IEEE Electron Device Letters, vol. 10, No. 3 (Mar. 1989), pp. 117–199.

*Primary Examiner*—Richard Booth
*Attorney, Agent, or Firm*—Renner, Otto, Boisselle & Sklar, P.L.L.

[57] ABSTRACT

In one embodiment, the present invention relates to a method of forming a flash memory cell involving the steps of: forming a tunnel oxide on a substrate; forming an in situ phosphorus doped polysilicon layer over the tunnel oxide by low pressure chemical vapor deposition at a temperature between about 610° C. and about 630° C., wherein the in situ phosphorus doped polysilicon layer comprises from about $1 \times 10^{19}$ atoms/cm$^3$ to about $5 \times 10^{19}$ atoms/cm$^3$ of phosphorus; forming an insulating layer over the in situ phosphorus doped polysilicon layer; forming a conductive layer over the insulating layer; etching the in situ phosphorus doped polysilicon layer, the conductive layer and the insulating layer, thereby defining one or more stacked gate structures; and forming a source region and a drain region in the substrate, wherein the source region and the drain region are self-aligned by the stacked gate structures, thereby forming one or more memory cells.

13 Claims, 3 Drawing Sheets

NARROWER ERASE DISTRIBUTION FOR FLASH MEMORY BY SMALLER POLY GRAIN SIZE

TECHNICAL FIELD

The present invention generally relates to flash memory devices such as EEPROMs. More particularly, the present invention relates to flash memory devices having a narrow erase distribution.

BACKGROUND ART

Nonvolatile memory devices include flash EEPROMs (electrical erasable programmable read only memory devices). FIG. 1 represents the relevant portion of a typical flash memory cell 10. The memory cell 10 typically includes a source region 12, a drain region 14 and a channel region 16 in a substrate 18; and a stacked gate structure 20 overlying the channel region 16. The stacked gate 20 includes a thin gate dielectric layer 22 (commonly referred to as the tunnel oxide) formed on the surface of the substrate 18. The stacked gate 20 also includes a polysilicon floating gate 24 which overlies the tunnel oxide 22 and an interpoly dielectric layer 26 which overlies the floating gate 24. The interpoly dielectric layer 26 is often a multilayer insulator such as an oxide-nitride-oxide (ONO) layer having two oxide layers 26a and 26b sandwiching a nitride layer 26c. Lastly, a polysilicon control gate 28 overlies the interpoly dielectric layer 26. The channel region 16 of the memory cell 10 conducts current between the source region 12 and the drain region 14 in accordance with an electric field developed in the channel region 16 by the stacked gate structure 20.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage ($V_{th}$) of its field effect transistor (FET) and inhibits current flow through the channel region through a subsequent "read" mode. The magnitude of the read current is used to determine whether a flash memory cell is programmed or not. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and a 0 V to the control gate and the substrate while floating the drain of the respective memory cell.

Referring again to FIG. 1, conventional source erase operations for the flash memory cell 10 operate in the following manner. The memory cell 10 is programmed by applying a relatively high voltage $V_G$ (e.g., approximately 12 volts) to the control gate 28 and a moderately high voltage $V_D$ (e.g., approximately 9 volts) to the drain region 14 in order to produce "hot" electrons in the channel region 16 near the drain region 14. The hot electrons accelerate across the tunnel oxide 22 and into the floating gate 24 and become trapped in the floating gate 24 since the floating gate 24 is surrounded by insulators (the interpoly dielectric 26 and the tunnel oxide 22). As a result of the trapped electrons, the threshold voltage of the memory cell 10 increases by about 3 to 5 volts. This change in the threshold voltage (and thereby the channel conductance) of the memory cell 10 created by the trapped electrons causes the cell to be programmed.

To read the flash memory cell 10, a predetermined voltage $V_G$ that is greater than the threshold voltage of an unprogrammed cell, but less than the threshold voltage of a programmed cell, is applied to the control gate 28. If the memory cell 10 conducts, then the memory cell 10 has not been programmed (the cell 10 is therefore at a first logic state, e.g., a zero "0"). Likewise, if the memory cell 10 does not conduct, then the memory cell 10 has been programmed (the cell 10 is therefore at a second logic state, e.g., a one "1"). Consequently, it is possible to read each cell 10 to determine whether it has been programmed (and therefore identify its logic state).

In order to erase the flash memory cell 10, a relatively high voltage $V_S$ (e.g., approximately 12 volts) is applied to the source region 12 and the control gate 28 is held at a ground potential ($V_G$=0), while the drain region 14 is allowed to float. Under these conditions, a strong electric field is developed across the tunnel oxide 22 between the floating gate 24 and the source region 12. The electrons that are trapped in the floating gate 24 flow toward and cluster at the portion of the floating gate 24 overlying the source region 22 and are extracted from the floating gate 24 and into the source region 12 by way of Fowler-Nordheim tunneling through the tunnel oxide 22. Consequently, as the electrons are removed from the floating gate 24, the memory cell 10 is erased.

There are advantages associated with a source erase operation compared to a channel erase operation. For example, a narrower erase distribution is associated with using a high positive voltage at the source region. Moreover, the source erase operation is insensitive to defects in the channel region since all tunneling occurs through the overlap region of the source region and the stacked gate (the floating gate in particular). However, a number of problems are associated with the source erase operation.

As a result of conventional fabrication techniques, the floating gate typically displays the effects of a "smiling face" phenomenon. For a number of reasons, some of which are understood and some of which are not understood, the bottom surface of the floating gate is rounded at the outer extremities. This phenomenon is illustrated in FIG. 2 (corresponding elements relative to FIG. 1 have corresponding reference numbers) which is an exploded view of FIG. 1. Referring to FIG. 2, a flash memory cell 10 including a substrate 18 is shown having thereon a tunnel oxide 22, a floating gate 24 over the tunnel oxide, an interpoly dielectric layer 26 over the floating gate 22, and a control gate 28 over the interpoly dielectric layer 26. Also shown are a drain region 14, a source region 12 and a channel region 16. Within the overlapped area 30, between the floating gate 24 and the source region, the "smiling face" phenomenon is illustrated. The "smiling face" phenomenon is characterized by a curvature at the bottom, outer edges of the floating gate which decreases overlap between the floating gate and the source region. Occurrence of the "smiling face" phenomenon lowers the efficiency of the erase operation because the area of overlap between the floating gate 24 and the source region 12 is undesirably decreased.

Another problem associated with conventional flash memory fabrication techniques is characterized by a small number of large oxide valley formations under the floating gate which cause nonuniform erase speed (thus a wide erase distribution). The problem of oxide valley formations is illustrated in FIG. 3 (corresponding elements relative to FIG. 2 have corresponding reference numbers) which is an exploded view of FIG. 2. In FIG. 3, the overlap area between the floating gate 24 and the source region 12 has an undesirably small number of relatively large oxide valley formations 32. Erase speed is higher in the oxide valley formations due to barrier height reduction and/or electron trap formation by the dopant of the floating gate.

In view of the aforementioned problems, there is a need for flash memory cells and methods of making such memory cells which permit efficient erasure operations while minimizing such problems associated with conventional flash memory cells and conventional fabrication techniques.

SUMMARY OF THE INVENTION

In one embodiment, the present invention relates to a method of forming a flash memory cell involving the steps of: forming a tunnel oxide on a substrate; forming an in situ phosphorus doped polysilicon layer over the tunnel oxide by low pressure chemical vapor deposition at a temperature between about 610° C. and about 630° C., wherein the in situ phosphorus doped polysilicon layer comprises from about $1 \times 10^{19}$ atoms/cm$^3$ to about $5 \times 10^{19}$ atoms/cm$^3$ of phosphorus; forming an insulating layer over the in situ phosphorus doped polysilicon layer; forming a conductive layer over the insulating layer; etching the in situ phosphorus doped polysilicon layer, the conductive layer and the insulating layer, thereby defining one or more stacked gate structures; and forming a source region and a drain region in the substrate, wherein the source region and the drain region are self-aligned by the stacked gate structures, thereby forming one or more memory cells.

In another embodiment, the present invention relates to a method of increasing overlap between a floating gate and a source region of a flash memory cell by forming the floating gate from an in situ phosphorus doped polysilicon layer over a tunnel oxide by low pressure chemical vapor deposition at a temperature between about 610° C. and about 630° C., wherein the in situ phosphorus doped polysilicon layer comprises from about $1 \times 10^{19}$ atoms/cm$^3$ to about $5 \times 10^{19}$ atoms/cm$^3$ of phosphorus.

In yet another embodiment, the present invention relates to a method of narrowing erase distribution in a flash memory cell by forming a floating gate from an in situ phosphorus doped polysilicon layer over a tunnel oxide by low pressure chemical vapor deposition at a temperature between about 610° C. and about 630° C., wherein the in situ phosphorus doped polysilicon layer comprises from about $1 \times 10^{19}$ atoms/cm$^3$ to about $5 \times 10^{19}$ atoms/cm$^3$ of phosphorus.

As a result of the present invention, a narrower erase distribution in flash memory cell is obtainable by reducing the grain size of the floating gate material. By reducing the grain size of the floating gate material, the "smiling face" phenomenon is reduced thereby increasing the overlap area between the floating gate and source region. Increased overlap facilitates electron flow from the floating gate to the source region. Moreover, reducing the grain size of the floating gate material results in an increase in the number of oxide valley formations in the overlap area thus decreasing the average size of the oxide valley formations. The increased number of oxide valley formations of decreased average size contributes to uniform erase speed.

DISCLOSURE OF INVENTION

Figure 1:
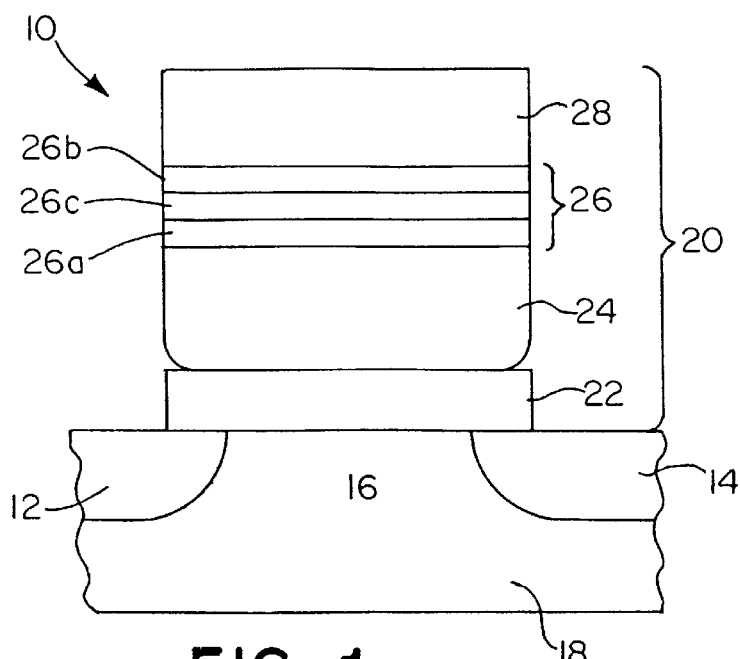
FIG. 1 is a cross-sectional view of relevant portions of a conventional memory cell in a flash memory cell.
Figure 2:
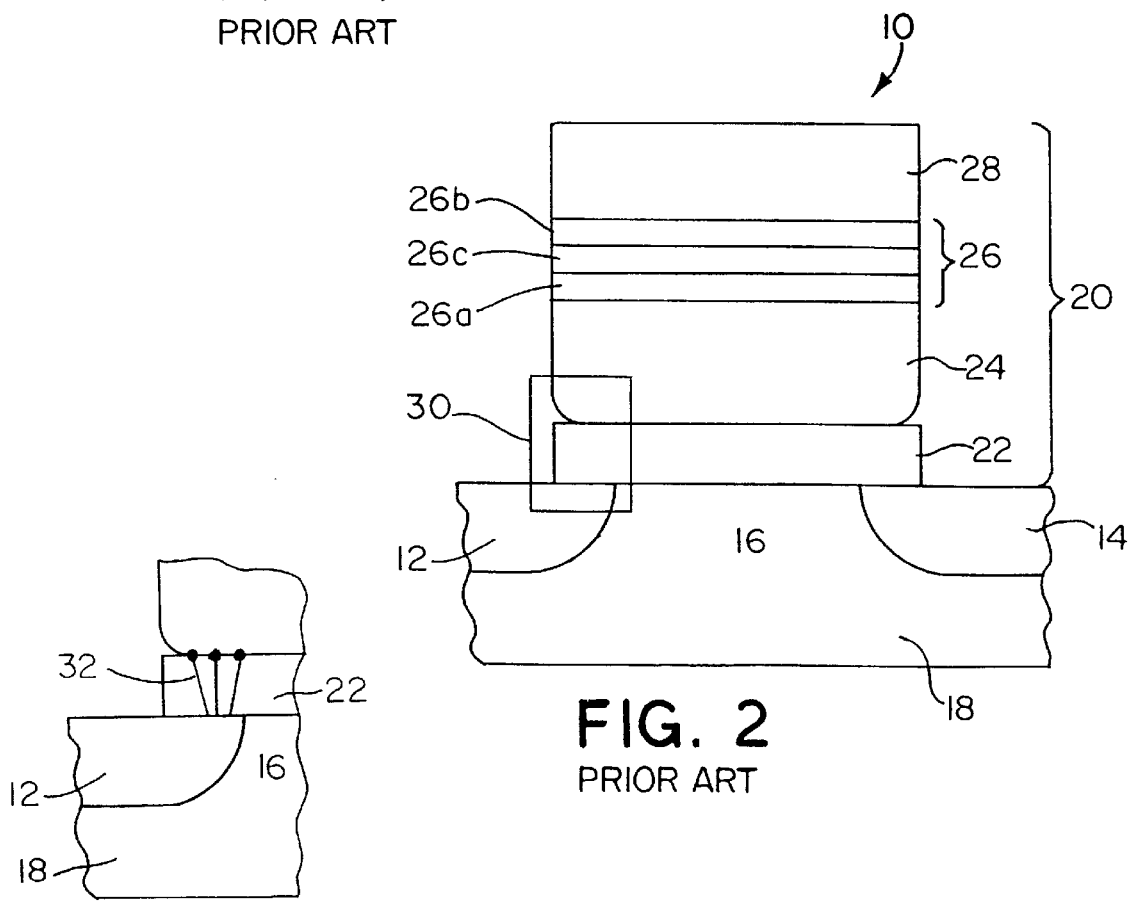
FIG. 2 is an exploded cross-sectional view of relevant portions of the conventional memory cell of FIG. 1.

By decreasing the grain size of the floating gate, a narrower erase distribution can be provided in flash memory cells. The floating gate is typically made of polysilicon containing a dopant. The dopant of the floating gate is typically a N-type dopant such as phosphorous. While not wishing to be bound to any theory, it is believed that by controlling various factors associated with forming the floating gate material, it is consequently possible to control the grain size of the resultant doped polysilicon.

The process conditions for forming the floating gate material involve depositing polysilicon via low pressure chemical vapor deposition (LPCVD) at a temperature between about 610° C. and about 630° C. and a pressure between about 180 mTorr and about 210 mTorr. In a preferred embodiment, the polysilicon is deposited by LPCVD at a temperature between 615° C. and about 625° C. and at a pressure between about 190 mTorr and about 205 mTorr. The polysilicon of the floating gate material is not doped by subsequent ion implantation; instead, the polysilicon is doped in situ. In other words, the polysilicon of the floating gate material is doped during its formation.

In situ doping and polysilicon deposition are performed via LPCVD under a gas flow of a silicon containing gas such as silane (SiH$_4$) between about 290 sccm and about 310 sccm and mixture of a phosphorous containing gas in an inert gas between about 30 sccm and about 35 sccm. In a preferred embodiment, in situ doping is conducted under a gas flow of silane between about 295 sccm and about 305 sccm with a mixture of a phosphorous containing gas in an inert gas between about 31 sccm and about 34 sccm. Inert gases include nonreactive gases including helium, neon, argon, krypton and xenon. In a preferred embodiment, the phosphorous containing gas is phosphine (PH$_3$) and the inert gas is helium. In one embodiment, the amount by weight of phosphorous containing gas in the inert gas is from about 0.9% to about 1.1%. In another embodiment, the amount by weight of phosphorous containing gas in the inert gas is from about 0.95% to about 1.05%.

The dopant level of phosphorus within the resultant floating gate material is relatively low. In one embodiment, the dopant level of phosphorus within the resultant floating gate material is from about $1 \times 10^{19}$ atoms/cm$^3$ to about $5 \times 10^{19}$ atoms/cm$^3$. In a preferred embodiment, the dopant level of phosphorus within the resultant floating gate material is from about $2 \times 10^{19}$ atoms/cm$^3$ to about $4 \times 10^{19}$ atoms/cm$^3$.

Referring to FIGS. 4A to 4H, the fabrication of a single flash memory cell is described. A plurality of flash memory cells can be formed on a semiconductor substrate, such as a silicon die, each with an N-type source region and N-type drain region formed within a P portion of the substrate and a P-type channel region interposed between the source and drain regions in accordance with the present invention. Although fabrication of one flash memory cell is described below, it will be understood by those skilled in the art that the methods described herein are applicable to mass production methods.

Figure 4A:
FIGS. 4A to 4H are cross-sectional views illustrating a flash memory cell fabrication method according to one embodiment of the present invention.

Specifically referring to FIG. 4A, a P-type substrate 40 is provided. Thereafter, a thin tunnel oxide layer 42 is formed over the substrate 40 having a thickness of, for example, about 50 to about 150 Angstroms using a thermal growth process in a dry oxidation furnace. For instance, the tunnel oxide layer 42 can be formed via dry oxidation at a temperature of about 1050° C., under an atmosphere of oxygen at about 1.33 l, HCl at about 70 cc and argon at about 12.61. Alternatively, the tunnel oxide can be formed from oxynitride.

Figure 4B:
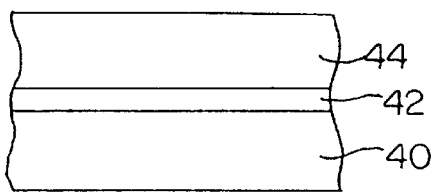

Referring to FIG. 4B, a phosphorus doped polysilicon layer is deposited via LPCVD to form an in situ phosphorus doped polysilicon layer 44 at 620° C., 200 mTorr, $SiH_4$ at 300 sccm, and a mixture of 1% by weight $PH_3$ in helium between about 30 and about 35 sccm. Doping lowers the resistivity of the polysilicon rendering it conductive.

Figure 4C:
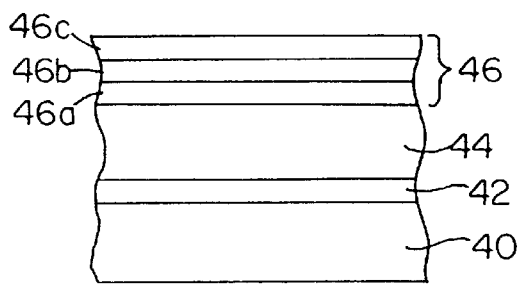

A multi-layer interpoly dielectric 46 is then formed over the surface of the substrate 40, as illustrated in FIG. 4C. This layer 46 is often called the interpoly dielectric since (as will be seen shortly) it is sandwiched between the in situ phosphorus doped polysilicon layer (first polysilicon layer constituting the floating gate for a flash memory cell) and a second polysilicon layer which forms the control gate for the cell. The interpoly dielectric 46 is preferably a three layer region of oxide/nitride/oxide (a so called "ONO") and typically has a thickness of about 150 to about 400 Angstroms. The ONO layer 46 is formed by repetitive depositions of oxide, nitride and oxide, as is known by those skilled in the art, to form a dielectric layer in which the nitride is sandwiched between the two oxide layers. Specifically referring to FIG. 4C, a first oxide layer 46a is deposited at a temperature of about 750° C. under $SiH_4$ at 20 cc, $N_2O$ at 1.2 l and a pressure of 600 mTorr via LPCVD oxide on the polysilicon layer. Nitride is next deposited at a temperature of about 760° C. under $NH_3$ at 600 cc, $SiH_2Cl_2$ at 100 cc and a pressure of 330 mTorr to form a nitride layer 46b. The nitride layer 46b is oxidized with wet oxygen at a temperature of about 950° C. under $O_2$ at 5 l and $H_2$ at 9 l for 40 minutes to form oxide layer 46c.

Figure 4D:
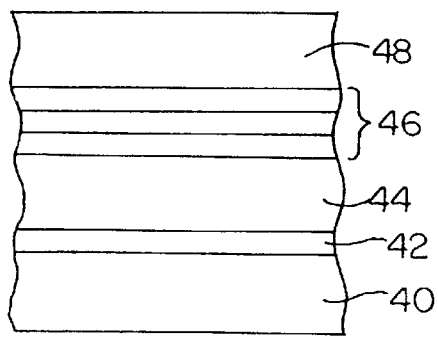
Figure 4E:
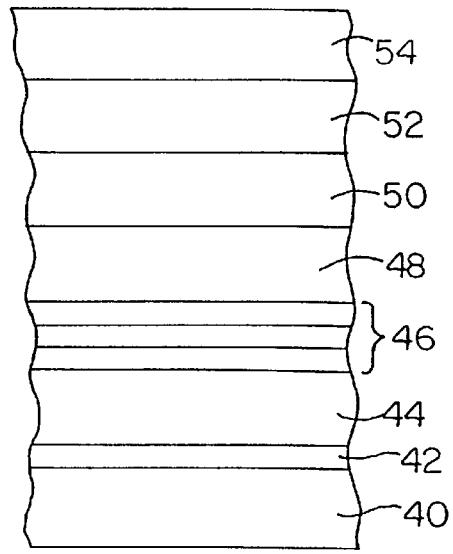

Referring to FIG. 4D, the second polysilicon layer is deposited. Specifically, a phosphorus doped amorphous polysilicon layer is deposited via LPCVD to form an in situ phosphorus doped polysilicon layer 48 at about 530° C., 400 mTorr, $SiH_4$ at 2,000 sccm, and a mixture of 1% by weight $PH_3$ in helium at about 75 sccm. Alternatively, the the second polysilicon layer can be deposited by LPCVD followed by ion implantation of a dopant such as phosphorus. Doping lowers the resistivity of the polysilicon rendering it conductive.

The remaining steps are generally well known in the art and may be varied. For instance, referring to FIG. 4E, in one embodiment a tungsten suicide layer 50 is deposited via, for example, LPCVD. The silicide layer 50 provides a lower resistance contact for improved flash memory cell performance. Poly-cap layer 52 is deposited over the tungsten silicide layer 50. The poly-cap layer 52 is about 500 Angstroms thick, and is formed via, for example, LPCVD. The poly-cap layer 52 can be used to prevent any potential peeling or cracking of the underlying tungsten silicide 50. A capping layer 54, for example, of SiON is deposited over the poly-cap layer 52. The capping silicon oxynitride layer 54 provides an anti-reflective coating at masking and also acts as a masking layer for subsequent etching.

Figure 4F:
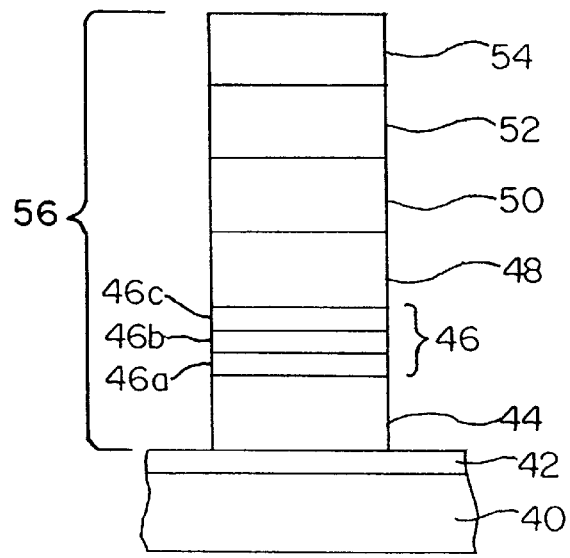
Figure 4G:
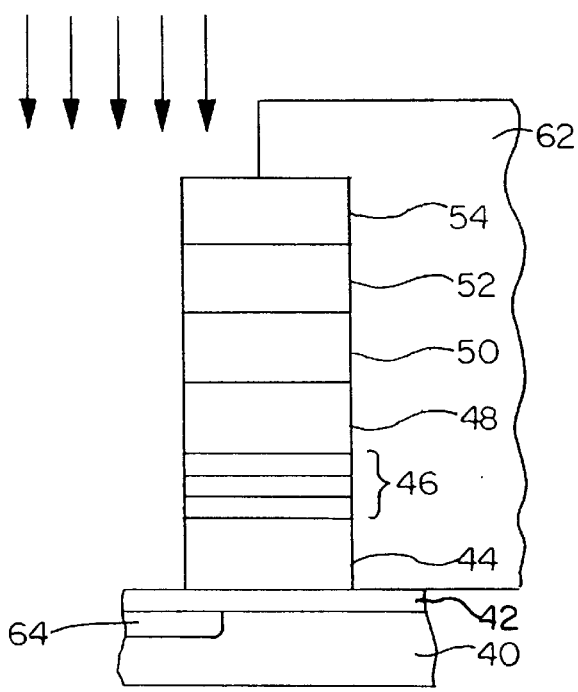

Referring to FIGS. 4F, standard lithography and etching procedures are used to remove various portions of the device. After the second polysilicon layer 48, the tungsten silicide layer 50, the poly-cap layer 52 and the capping layer 54 have been formed (a plurality of word lines for the memory cells can be defined in this manner) etching is performed to define one or more pre-stack structures. The etching may be achieved by depositing and defining a photoresist masking layer over the entire surface of the substrate using standard lithography procedures. This is generally termed the gate mask and gate etch. Subsequently, a number of successive etching steps, such as the gate etch and the self aligned etch, are performed to define one or more stack structures 56. This is generally termed the self aligned mask and self aligned etch.

The gate mask and gate etch are performed as follows. First, a resist (not shown) is applied, selectively developed and various portions removed. Next, in one embodiment, the etching steps take place in a multi-chamber etch tool wherein a silicon oxynitride capping layer is selectively etched with a fluorinated chemistry such as $CHF_3$—$O_2$ in an oxide chamber. The exposed poly-cap layer and the tungsten silicide layer are then etched with $SF_6$/HBr (or alternatively, $SF_6/Cl_2$ or $Cl_2$—$O_2$) and the exposed second polysilicon layer is etched with HBr—$O_2$ in a poly chamber. Etching steps are preferably formed in an integrated process in which the wafers are not exposed to atmosphere when transferring the wafers from one chamber to another.

Once the second polysilicon layer 48, the tungsten suicide layer 50, the poly-cap layer 52 and the capping layer 54 have been removed, a self aligned etch ("SAE") is performed to remove the ONO layer 46 and the in situ phosphorus doped polysilicon layer (first polysilicon layer) 44 in the regions that arc not covered by the pre-stack structure (constituted by the unremoved second polysilicon layer, tungsten silicide layer, poly-cap layer and capping layer). The SAE etch is a two step etch process in which the ONO layer 46 is first removed using, for example, a $CF_4$—$O_2$ RIE etch. The second phase of the SAE etch is the removal of the exposed first polysilicon layer 44 to thereby further define the floating gate structures for each respective word. The polysilicon etch includes, for example, an HBr—$O_2$ or a HBr—$Cl_2$—$O_2$ RIE etch chemistry. The gate etch and SAE serve to define the stack structure 56.

Figure 4H:
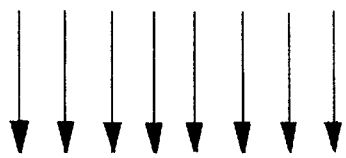

The fabrication of the flash memory cells is then completed by forming the source and drain regions by, for example, ion implantation. During the formation of the source and drain regions, the stacked gate structure 56 serves as a self-aligning mechanism. Specifically referring to FIG. 4G, resist 62 is applied and selectively stripped followed by performing a first ion implantation using phosphorus ($1\times10^{14}$ ions/$cm^2$ at 60 KeV) to form an N-type source region 64 (double diffused implant). Referring to FIG. 4H, resist 62 is removed followed by performing a second ion implantation using arsenic ($5\times10^{14}$ ions/$cm^2$ at 40 KeV) to form deep N-type source region 66, shallow N-type source region 68 and N-type drain region 70 (modified drain diffusion). Annealing completes the formation of the source and drain regions. In the above manner, an easy method for forming flash memory cells is provided. Although a flash memory cell with a double-diffused source region is described, the present invention is also applicable to flash memory cells with a single-diffused source region.

Figure 3:
FIG. 3 is an exploded cross-sectional view of relevant portions of the conventional memory cell of FIG. 2.
Figure 5:
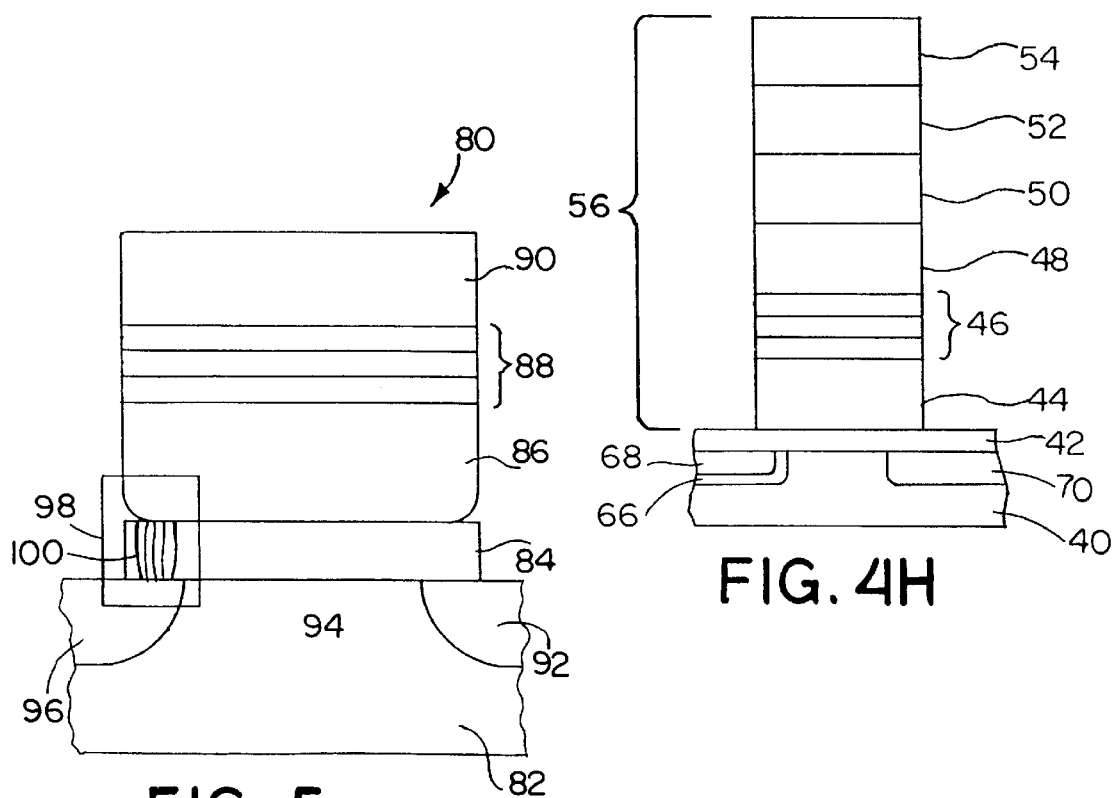
FIG. 5 is a cross-sectional view of a memory cell in a flash array according to one embodiment of the present invention.

A flash memory cell according to one embodiment of the present invention is illustrated in FIG. 5. Referring to FIG. 5, a memory cell 80 includes a substrate 82 having a tunnel oxide layer 84 thereover, a floating gate 86 made of an in situ phosphorus doped polysilicon over the tunnel oxide layer 84, an interpoly dielectric layer 88 typically constituted by an ONO type stricture over the floating gate 86, and a control gate 90 made of doped polysilicon over the interpoly dielectric layer 88. Also shown is the drain region 92, channel region 94 and source region 96. Specifically referring to the overlap area 98 between the floating gate 86 and the source region 96, a relatively large number of small oxide valley formations 100 are illustrated (as compared to Prior Art FIG. 3).

The relatively small number of valley oxide formations contributes to uniform erase speed in the memory cell. During programming, the source region 96 and the substrate 82 of the memory cell may be tied to a ground via a terminal (not shown), respectively, the drain region 92 is coupled to a relatively high voltage (for example, between about +5 V to about +9 V) via a terminal (not shown) and the control gate 90 is connected to a relatively high voltage level (for example, above about +10 V) via a terminal (not shown). Electrons are accelerated from the source region 96 to the drain region 92 and so-called "hot-electrons" are generated near the drain region 92. Some of the hot electrons are injected through the relatively thin tunnel oxide layer 84 and become trapped in the floating gate 86 thereby providing the floating gate 86 with a negative potential.

During erasure, a high positive voltage (such as above about +12 V) is applied to the source region 96 via a source terminal (not shown). A ground potential ($V_g$ equals 0 V) is applied to the control gate 90 via the control terminal (not shown). A similar ground potential ($V_{sub}$ equals 0 V) is applied to the substrate 82 via a substrate terminal (not shown).

The voltage $V_D$ of the drain region 92 is permitted to float. In this mode, electrons previously stored during programming in the floating gate 86 pass through an overlap area 98 by way of Fowler-Nordheim tunneling and travel into the source region 96 as a result of the electric field established between the control gate 90 and the source region 96 ($V_{GS}$ equals about 12 V). Since the floating gate 86 of memory cell 80 does not exhibit the smiling face phenomenon, Fowler-Nordheim tunneling and travel of electrons from the floating gate 86 to the source region 96 are facilitated.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a flash memory cell, comprising:

forming a tunnel oxide on a substrate;

forming an in situ phosphorus doped polysilicon layer over the tunnel oxide by low pressure chemical vapor deposition at a temperature between about 610° C. and about 630° C. and at a pressure from about 180 mTorr to about 210 mTorr, wherein the in situ phosphorus doped polysilicon layer comprises from about $1 \times 10^{19}$ atoms/cm$^3$ to about $5 \times 10^{19}$ atoms/cm$^3$ of phosphorus, the in situ phosphorus doped polysilicon layer is formed using a silicon containing gas and a mixture of a phosphorus gas and an inert gas, and the mixture comprises from about 0.9 to about 1.1% by weight of a phosphorus gas in an inert gas;

forming an insulating layer over the in situ phosphorus doped polysilicon layer;

forming a conductive layer over the insulating layer;

etching at least the in situ phosphorus doped polysilicon layer, the conductive layer and the insulating layer, thereby defining at least one stacked gate structure; and forming a source region and a drain region in the substrate, wherein the source region and the drain region are self-aligned by the stacked gate structure, thereby forming at least one memory cell.

2. The method of claim 1, wherein the temperature of forming the in situ phosphorus doped polysilicon layer is between about 615° C. and about 625° C.

3. The method of claim 1, wherein the in situ phosphorus doped polysilicon layer comprises from about $2 \times 10^{19}$ atoms/cm$^3$ to about $4 \times 10^{19}$ atoms/cm$^3$ of phosphorus.

4. The method of claim 1, wherein the phosphorus gas is phosphine.

5. The method of claim 1, wherein the inert gas is helium.

6. A method of increasing overlap between a floating gate and a source region of a flash memory cell, comprising:

forming the floating gate from an in situ phosphorus doped polysilicon layer over a tunnel oxide by low pressure chemical vapor deposition at a temperature between about 610° C. and about 630° C. and at a pressure from about 180 mTorr to about 210 mTorr, wherein the in situ phosphorus doped polysilicon layer comprises from about $1 \times 10^{19}$ atoms/cm$^3$ to about $5 \times 10^{19}$ atoms/cm$^3$ of phosphorus, the in situ phosphorus doped polysilicon layer is formed using a silicon containing gas and a mixture of a phosphorus gas and an inert gas, and the mixture comprises from about 0.9 to about 1.1% by weight of a phosphorus gas in an inert gas.

7. The method of claim 6, wherein the floating gate does not exhibit a smiling face phenomenon.

8. The method of claim 6, wherein the temperature of forming the in situ phosphorus doped polysilicon layer is between about 615° C. and about 625° C.

9. The method of claim 6, wherein the in situ phosphorus doped polysilicon layer comprises from about $2 \times 10^{19}$ atoms/cm$^3$ to about $4 \times 10^{19}$ atoms/cm$^3$ of phosphorus.

10. A method of narrowing erase distribution in a flash memory cell comprising a substrate, a tunnel oxide over the substrate, a floating gate over the tunnel oxide, an insulating layer over the floating gate, and a conductive layer over the insulating layer, comprising:

forming the floating gate from an in situ phosphorus doped polysilicon layer over a tunnel oxide by low pressure chemical vapor deposition at a temperature between about 610° C. and about 630° C. and at a pressure from about 180 mTorr to about 210 mTorr, wherein the in situ phosphorus doped polysilicon layer comprises from about $1 \times 10^{19}$ atoms/cm$^3$ to about $5 \times 10^{19}$ atoms/cm$^3$ of phosphorus, the in situ phosphorus doped polysilicon layer is formed using a silicon containing gas and a mixture of a phosphorus gas and an inert gas, and the mixture comprises from about 0.9 to about 1.1% by weight of a phosphorus gas in an inert gas.

11. The method of claim 10, wherein the floating gate does not exhibit a smiling face phenomenon.

12. The method of claim 10, wherein the temperature of forming the in situ phosphorus doped polysilicon layer is between about 615° C. and about 625° C.

13. The method of claim 10, wherein the in situ phosphorus doped polysilicon layer comprises from about $2 \times 10^{19}$ atoms/cm$^3$ to about $4 \times 10^{19}$ atoms/cm$^3$ of phosphorus.

* * * * *

UNITED STATES PATENT AND TRADEMARK OFFICE
CERTIFICATE OF CORRECTION

PATENT NO. : 5,981,339
DATED : Nov. 9, 1999
INVENTOR(S) : Chang et al.

It is certified that error appears in the above-identified patent and that said Letters Patent is hereby corrected as shown below:

Column 5, Line 62

The word "suicide" is incorrect.
    The correct word should be "silicide".

Column 6, Line 35

The word "suicide" is incorrect.
    The correct word should be "silicide".

Column 7, Line 9

The word "stricture" is incorrect.
    The correct word should be "structure".

Signed and Sealed this

Eighteenth Day of July, 2000

*Attest:*

Q. TODD DICKINSON

*Attesting Officer*     *Director of Patents and Trademarks*